(12) United States Patent
Bult et al.

(10) Patent No.: US 7,170,435 B2
(45) Date of Patent: Jan. 30, 2007

(54) METHOD FOR OPERATING AN ANALOG TO DIGITAL CONVERTER

(75) Inventors: Klaas Bult, Dana Point, CA (US); Chi-Hung Lin, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/810,053

(22) Filed: Mar. 26, 2004

(65) Prior Publication Data

US 2004/0227653 A1    Nov. 18, 2004

Related U.S. Application Data

(63) Continuation of application No. 10/320,016, filed on Dec. 16, 2002, now Pat. No. 6,714,150, which is a continuation of application No. 10/175,663, filed on Jun. 20, 2002, now Pat. No. 6,522,279, which is a continuation of application No. 09/909,282, filed on Jul. 19, 2001, now Pat. No. 6,414,618, which is a continuation of application No. 09/753,874, filed on Jan. 3, 2001, now Pat. No. 6,268,816, which is a continuation of application No. 09/458,331, filed on Dec. 10, 1999, now Pat. No. 6,191,719, which is a continuation of application No. 08/917,408, filed on Aug. 25, 1997, now abandoned.

(51) Int. Cl.
*H03M 1/66* (2006.01)

(52) U.S. Cl. ...................................... 341/144

(58) Field of Classification Search ................ 341/144, 341/133, 145, 150, 153, 154, 148, 136, 143, 341/162; 323/317; 257/197, 327, 139, 140, 257/141, 138, 143, 136
See application file for complete search history.

(56) References Cited

U.S. PATENT DOCUMENTS 4,342,984 A * 8/1982 Berke et al. ................ 341/141

(Continued)

OTHER PUBLICATIONS

Article entitled "An 8-bit 2-ns Monolithic DAC", IEEE Journal of Solid-State Curcuits, vo. 23, No. 1, Feb. 1998, pp. 142-146.

(Continued)

*Primary Examiner*—Brian Young
(74) *Attorney, Agent, or Firm*—Sterne, Kessler, Goldstein & Fox PLLC

(57) ABSTRACT

Binary indications are converted to an analog representation with significant reduction in ringing at the transitions between successive binary indications and in the period during each binary indication. The binary indications are disposed in a row-and-column matrix to provide a thermometer code. Each stage of the converter includes a decoder and latch arranged so the decoder inputs settle before the latch is set by the clock pulses. The stages are implemented in complementary CMOS. Complementary transistors are biased so one transistor of the pair is driven to the rail while the other transistor of the pair floats. A dummy CMOS transistor is used to balance the number of transistors in the decoder paths.

4 Claims, 5 Drawing Sheets

U.S. PATENT DOCUMENTS

| | | | |
|---|---|---|---|
| 4,905,189 A | | 2/1990 | Brunolli |
| 5,084,701 A | * | 1/1992 | Sauerwald .................. 341/118 |
| 5,105,193 A | | 4/1992 | Vogt et al. |
| 5,689,257 A | | 11/1997 | Mercer et al. |
| 5,825,317 A | | 10/1998 | Anderson et al. |
| 5,870,044 A | | 2/1999 | Dell'ova et al. |
| 5,920,273 A | | 7/1999 | Hirano |
| 6,037,888 A | | 3/2000 | Nairn |
| 6,052,074 A | | 4/2000 | Iida |
| 6,157,333 A | * | 12/2000 | Louagie et al. ............. 341/144 |
| 6,191,719 B1 | | 2/2001 | Bult et al. |
| 6,268,816 B1 | | 7/2001 | Bult et al. |
| 6,414,618 B2 | | 7/2002 | Bult et al. |
| 6,509,854 B1 | * | 1/2003 | Morita et al. ............... 341/144 |
| 6,522,279 B2 | | 2/2003 | Bult et al. |
| 6,650,266 B1 | * | 11/2003 | Tester ......................... 341/144 |
| 6,714,150 B2 | * | 3/2004 | Bult et al. .................. 341/144 |

OTHER PUBLICATIONS

Article entitled "a 27-MHz Digital-to-Analog Video Processor", IEEE Journal of Solid-State Circuits, vol. 23, No. 6, Dec. 1988, pp. 1358-1369.

Vogt, Alexander W. et al., Article entitled "A 10-Bit High Speed CMOS DAC Macrocell", 1989 pp. 6.7.1-6.7.4, no month.

* cited by examiner

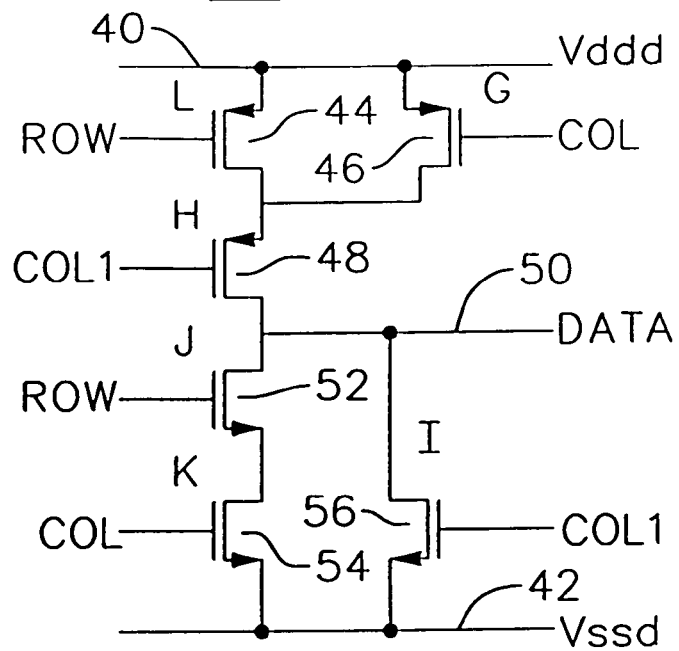
FIG.3
PRIOR ART
FIG.4
| | A<br>1 | B<br>1 | C<br>0 | D<br>0 |
|---|---|---|---|---|
| A' 1 | 1 | 1 | 0 | 0 |
| B' 1 | 1 | 1 | 0 | 0 |
| C' 0 | 1 | 0 | 0 | 0 |
| D' 0 | 1 | 0 | 0 | 0 |
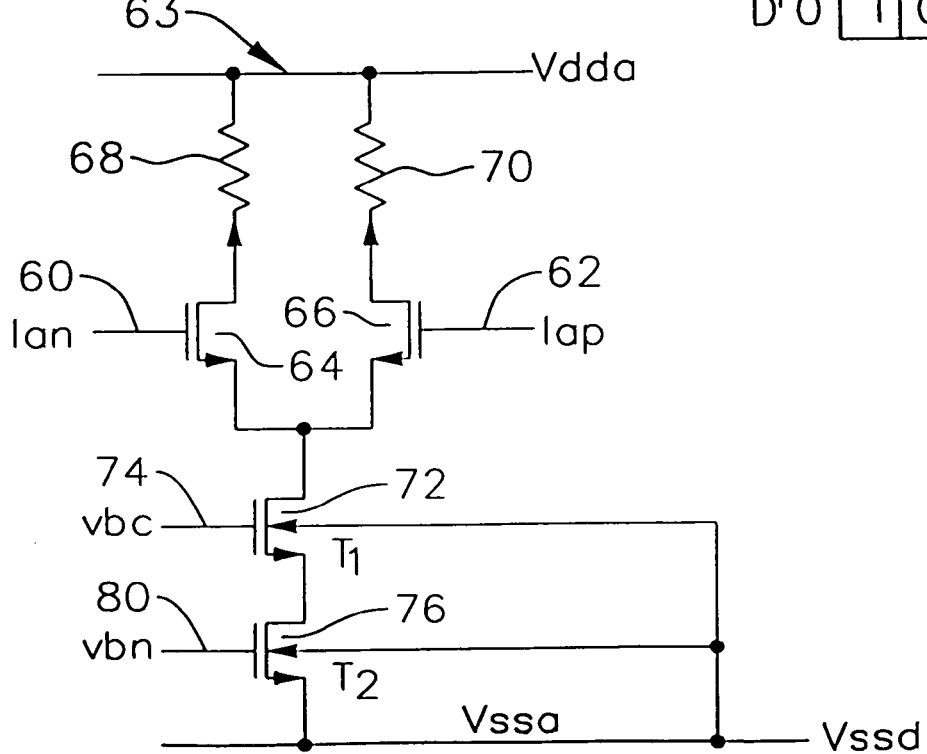
FIG.5
PRIOR ART

METHOD FOR OPERATING AN ANALOG TO DIGITAL CONVERTER

CROSS-REFERENCE TO RELATED APPLICATIONS

This application is a continuation of application Ser. No. 10/320,016, filed Dec. 16, 2002 now U.S. Pat. No. 6,714,150, which is a continuation of application Ser. No. 10/175,663, filed Jun. 20, 2002 now U.S. Pat. No. 6,522,279, which is a continuation of application Ser. No. 09/909,282, filed Jul. 19, 2001 now U.S. Pat. No. 6,414,618, which is a continuation of application Ser. No. 09/753,874, filed Jan. 3, 2001 (now U.S. Pat. No. 6,268,816), which is a continuation of application Ser. No. 09/458,331, filed Dec. 10, 1999 (now U.S. Pat. No. 6,191,719), which is a continuation of application Ser. No. 08/917,408, filed Aug. 25, 1997, now abandoned.

This invention relates to digital-to-analog converters. More particularly, the invention relates to digital-to-analog converters in which a plurality of binary indications representing a value are converted to an analog current or an analog voltage representing the value without any ringing during the binary indications or at the transitions between successive binary indications.

BACKGROUND OF THE INVENTION

Most parameters such as measurements of temperature, humidity and pressure are analog. For example, the use of a mercury thermometer to measure the temperature of a patient is analog since the temperature is measured by the rise of a mercury column. However, temperature may also be indicated digitally. For example, an indication of a temperature of "98.6" may be provided digitally by providing three separate indications of "9", "8" and "6".

Generally, when parameters such as temperature or pressure are measured on an analog basis and these measurements are used to provide calculations for controlling the operation of a system in which the values of temperature and pressure are regulated, the analog values are converted to digital values for providing the calculations. The calculations are then converted to digital values to provide the regulation of the parameters such as temperature and pressure.

Integrated circuit chips are generally provided for converting digital indications of a value to an analog representation of the value. Preferably this conversion is provided in as short a time (or as high a frequency) as possible. Minimizing the time for the conversion is desirable because it provides for an enhanced regulation of the values of parameters such as pressure and temperature.

Integrated circuit chips have been progressively provided through the years with decreased micron size. In other words, the thickness of the electrical leads connecting the different components in the electrical circuitry on the integrated circuit chip has been progressively decreased through the years. For example, the micron size of the electrical leads on an integrated circuit chip have progressively decreased in size during the past ten (10) years from approximately two (2) microns to approximately one half micron (0.5µ) or less. Decreases in micron size have produced corresponding increases in the frequency at which the electrical circuits on the integrated circuit chip are able to operate. For example, electrical circuits made from CMOS technology on an integrated circuit chip are now able to operate at frequencies in the order of several hundred megahertz in comparison to frequencies less than one hundred megahertz (100 Mhz) ten years ago.

Digital-to-analog converters have problems of ringing, particularly when they operate at high frequencies. The ringing occurs during the period of each of the binary indications. The ringing also occurs at the transitions between successive ones of the binary indications. The ringing obscures the generation of the analog current or analog voltage which represents the cumulative value of the binary indications. The ringing becomes pronounced because of the high frequencies at which the digital-to-analog converters operate. As previously indicated, these high frequencies are provided because of the progressive decrease in the micron size of the electrical leads, and the progressive decrease in the dimensions of devices such as transistors, in the integrated circuit chips.

BRIEF DESCRIPTION OF THE INVENTION

In one embodiment of the invention, binary indications are converted to an analog representation with significant reductions in ringing at the transitions between successive binary indications or in the period during each binary indication. The binary indications are disposed in a row-and-column matrix to provide a thermometer code. The converter includes pluralities of decoders and latches, each decoder being associated with an individual latch. Each decoder responds to binary indications of an individual row and an individual column and the next column to produce a latched pair of output indications, inverted relative to each other, in synchronism with a clock signal.

The production of the latched outputs in synchronism with the clock signal inhibits ringing in the period during each binary indication. Each pair of inverted latch outputs is respectively introduced to a differential amplifier, formed from MOS transistors of the p type, in an individual one of a plurality of current sources. Each differential amplifier has a pair of branches each responsive to the paired inverted outputs from the associated latch in an opposite relationship to that of the other branch.

The p type transistors in each differential amplifier inhibit ringing in such amplifier at the transitions between the successive binary indications. Each branch in each differential amplifier is connected to a resistor Common to the corresponding branches in the other differential amplifiers. Such branches pass through such resistor a current dependent upon the cumulative current through such branches. This cumulative current provides the analog representation.

BRIEF DESCRIPTION OF THE DRAWINGS

FIG. 3 is a circuit diagram of circuitry of the prior art, such circuitry being used in the block diagram of FIG. 1 for providing a binary-to-thermometer decoding of a binary indications in a plurality of cells when the cells are disposed in a matrix relationship;

FIG. 4 is an example of binary indications in cells disposed in a matrix relationship for decoding by the circuitry shown in FIG. 3;

FIG. 5 is a circuit diagram of a current source of the prior art for use in the block diagram of FIG. 1 for converting a binary indication in a cell to an analog representation;

DETAILED DESCRIPTION OF THE INVENTION

Figure 1:
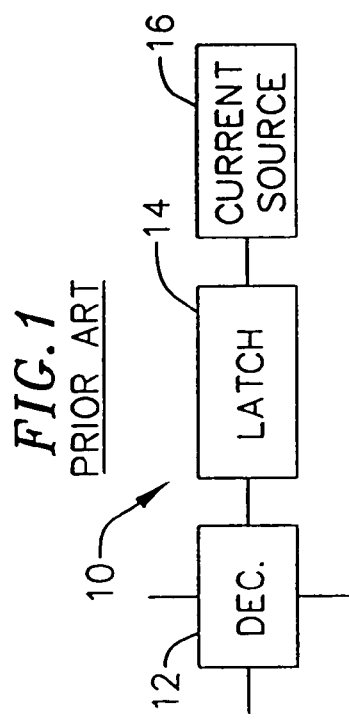
FIG. 1 is a general block diagram of digital-to-analog converters of the prior art.

FIG. 1 is a block diagram of a digital-to-analog converter, general indicated at 10, of the prior art. The converter includes three (3) blocks: a decoder 12, a latch 14 and a current source 16. The decoder 12 receives binary indications, preferably in a thermometer code, from a plurality of cells and provides signals (currents or voltages) representative of these binary indications. The latch 14 produces latched outputs representative of the currents or voltages produced by the decoder 12. The current source 16 produces currents representative of the latched outputs from the different cells and accumulates these currents in an output impedance for the binary indications from the different cells to provide in the output impedance a current representing the analog value.

Figure 2:
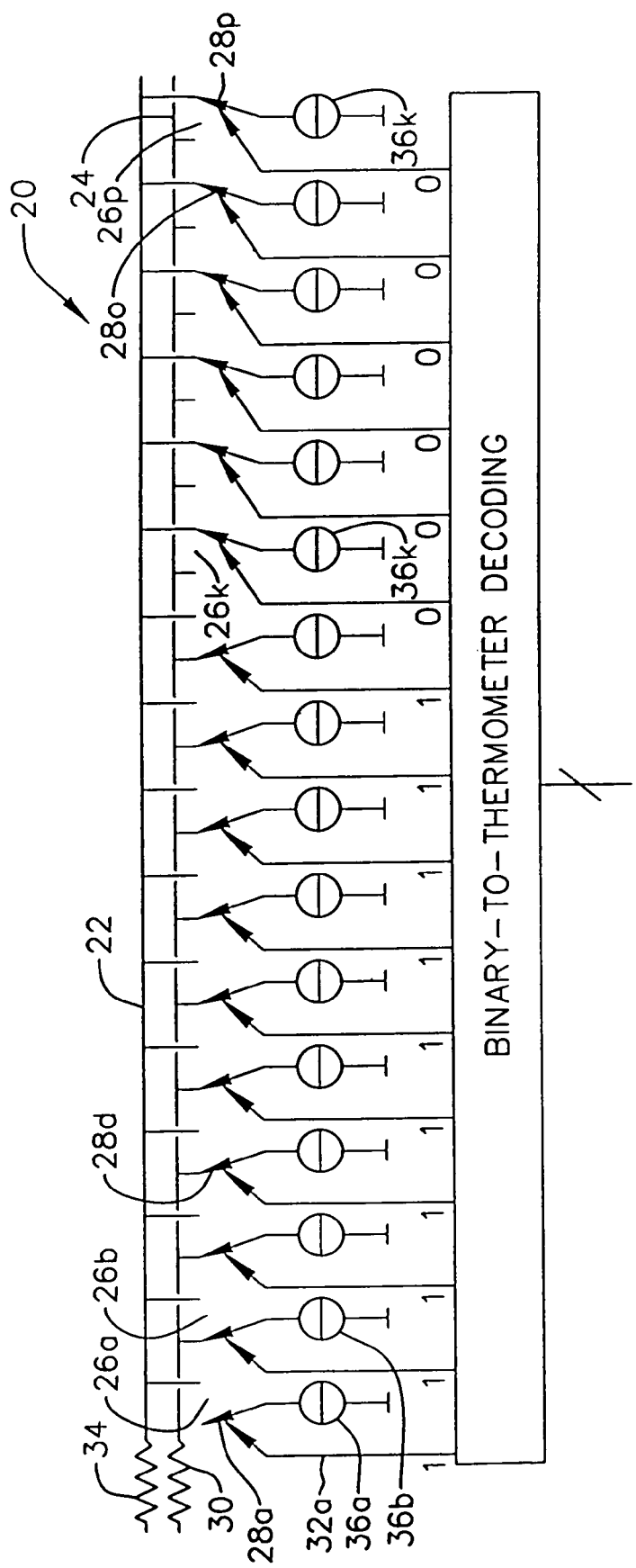
FIG. 2 is a circuit diagram of circuitry of the prior art, such circuitry being used in the block diagram of FIG. 1 for providing a binary-to-thermometer decoding of a plurality of binary indications.

FIG. 2 is a circuit diagram of binary-to-thermometer converter generally indicated at 20. The circuitry 20 includes a first line 22 and a Second line 24. A plurality of switches 26a–26p is provided. Each of the switches 26a–26p has a first stationary contact connected to the line 22 and a second stationary contact connected to the line 24. Each of the switches 26a–26p has a contact 28a–28p movable between the lines 22 and 24. For example, the contact 28a may be continuous with the line 22 for a binary value of 1 and may be continuous with the line 24 for a binary value of 0.

When the movable contact of a switch such as the movable contact 28a of the switch 26a establishes continuity with the line 24, a continuous circuit is established which includes a resistor 30, the line 24, the movable contact of the switch and a line such as a line 32a. This is true for the switches 26a–26j in FIG. 2. In this way, the resistor 30 receives the current cumulatively flowing through the switches 26a–26j in FIG. 2. This cumulative current may be considered to represent an inverse of the analog value of the binary indications from the cells in FIG. 2.

When the movable contact of a switch such as the movable contact 28k of the switch 26k is continuous with the line 22, a continuous circuit is established through a circuit including a resistor 34, the line 22, the switch 26k and a source 36k of a substantially constant current. This is true of the switches 26k–26p in FIG. 2. In this way, the resistor 30 receives the current cumulatively flowing through the switches 26k–26p in FIG. 2. This cumulative current may be considered to represent the analog value of the binary indications in FIG. 2.

FIG. 3 indicates a decoder for use with the matrix relationship shown in FIG. 3 to decode the binary indications of one of the cells in the matrix relationship. A similar decoder is provided for each of the other cells in the matrix relationship. The decoder shown in FIG. 3 includes a line 40 for providing a positive voltage such as five (5) volts and a line 42 for providing a voltage such as ground. The lines 40 and 42 are also respectively designated as "$V_{ddd}$" and "$V_{ssd}$" where the last letter in the sub-designation indicates a digital circuit. Three (3) transistors 44, 46 and 48, all preferably CMOS transistors of the p type, are connected between the line 40 and a data line 50 for the particular cell.

The gate of the transistor 44 receives a voltage representative of the binary indication of the row in which the particular cell is disposed. The gate of the transistor 46 receives a voltage representative of the binary indication of the column in which the particular cell is disposed. The gate of the transistor 48 receives a voltage representative of the binary indications in the next column. If all of the cells in the next column have a binary indication of "0", the gate of the transistor 48 receives a low voltage. Otherwise, the gate of the transistor 48 receives a high voltage. The sources of the transistors 44 and 46 are common line with the line 40. The drain of the transistor 42 has a connection with the line 50. The drains of the transistors 44 and 46 and the source of the transistor 48 are common.

Transistors 52, 54 and 56, all preferably CMOS transistors of the N type, are disposed between the data line 50 and the ground line 42. The drains of the transistors 52 and 56 are connected to the data line 50. The source of the transistor 52 and the drain of the transistor 54 have a common connection. The sources of the transistors 54 and 56 are common with the ground line 42. The gate of the transistor 52 receives the binary indication representing the row in which the particular cell is disposed, and the gate of the transistor 54 receives the binary indication representing the column in which the particular cell is disposed. A binary indication representing the next column is introduced to the gate of the transistor 56.

When binary indications of 0 are introduced to the gates of the transistors 44, 46 and 48, these transistors become conductive. As a result, a high voltage is produced on the line 50 to indicate a binary value of "0" for a cell. When high voltages are introduced to the gates of the transistors 52, 54 and 56, all of these transistors become conductive. This cause a low voltage to be produced on the line 50 to indicate a binary "1".

The voltage on the line 50 in FIG. 3 is introduced to a pair of lines 60 and 62 in FIG. 5, which shows a current source generally indicated at 63 of the prior art. These lines are respectively designated as "lan" and "lap" where the "n" in "lan" indicates "negative" and the "p" in "lap" indicates "positive". The lines 60 and 62 in FIG. 5 are respectively introduced to the gates of a pair of transistors 64 and 66, both preferably CMOS transistor of the n type. The drains of the transistors 64 and 66 are respectively connected to first terminals of resistors 68 and 70, the second terminals of which are common with a line 71 providing a positive voltage. The line 71 is also designated as Vdda where "a" indicates an analog voltage.

The drains of the transistors 64 and 66 are common with the drain of a transistor 72. The gate of the transistor 72 receives a constant bias voltage on a line 74. The source of the transistor 72 and the drain of a transistor 76 are common.

A constant bias voltage on a line 80 is applied to the gate of the transistor 76. The source of the transistor 76 is connected to a line 81. The line 81 is also designated as "$V_{ssa}$" where "a" indicates an analog circuit.

The current source 63 is provided for one of the cells in the matrix relationship shown in FIG. 4. It will be appreciated that a corresponding current source is provided for each individual one of the cells in the matrix relationship. However, the resistors 68 and 70 are common to all of the current cells in the matrix relationship. The resistor accordingly provides an analog current representing the analog value of the binary indications introduced to the cells in the matrix relationship.

The voltage on the gate of one of the transistors 64 and 66 represents an inverse value of the voltage produced on the line 50 in FIG. 3. Because of this, only one of the transistors 64 and 66 is conductive at any instant. For example, when the transistor 66 is conductive, current flows through a circuit including the line 71, the resistor 70, the transistor 66, the transistor 72, the transistor 76 and the line 81.

The transistor 76 is biased at its gate by the voltage on the line 80 so that the current through the circuit described in the previous sentence is substantially constant. The transistor 72 is biased at its gate by the voltage on the line 74 so that a high impedance is produced in the circuit. This high impedance is provided to compensate for the fact that the resistors 68 and 70 receive currents from a number of current sources and that the number of current sources connected to each individual one of the resistors 68 and 70 at any instant may vary dependent upon the values of the voltages applied to each individual one of the transistors 64 and 66 in the different current sources.

FIG. 4 indicates a matrix relationship for a decoder. In a matrix relationship, the binary indications are disposed in rows and columns. In this relationship, progressive binary indications of "1" are provided for the successive cells downwardly in the first column from the top of the column and in the first two (2) rows of the second column. All of the other indications for the cells in the matrix relationship are a binary "0". In this matrix relationship, if the value of the binary indications in the matrix relationship were to be increased by an integer, the cell in the third row in the second column would become a binary "1" instead of a binary "0".

Figure 6:
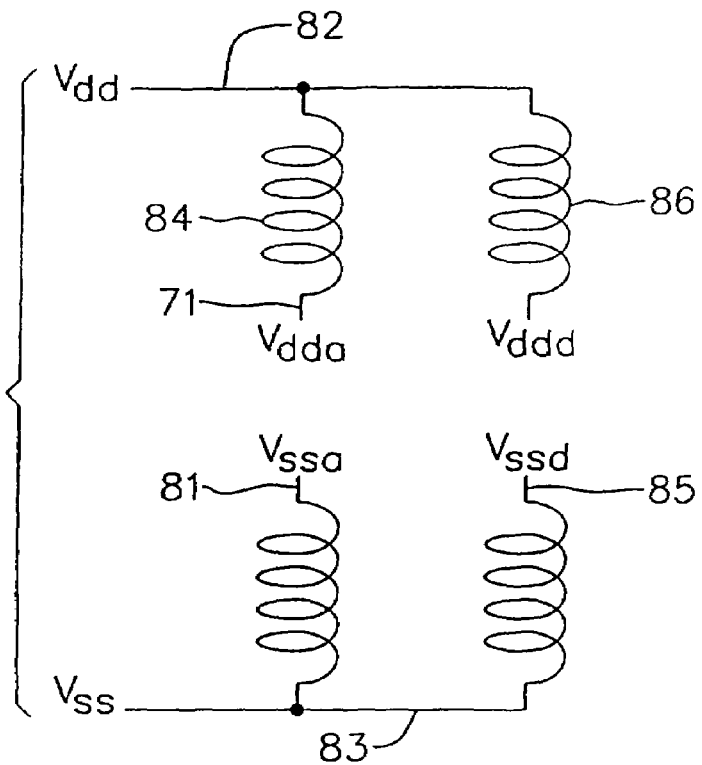
FIG. 6 is a schematic diagram showing inductances which are produced in the converter of FIG. 1 and which affect the operation of such converter.

FIG. 6 indicates the inductances provided in the converters of the prior art. Similar inductances exist in the converters of this invention. These inductances result from bond wires and leads from chip packages. For example, an inductance 84 may be provided between a line 82 providing a positive voltage designated as $V_{dd}$ and the line 71 providing a positive voltage designated as $V_{dda}$ for the analog circuitry. The inductance may be approximately five (5) nanohenries for each cell. Assuming that there are approximately sixty (60) cells, the cumulative inductance may be as high as three hundred (300) nanohenries. Similarly an inductance of approximately three hundred (300) nanohenries may be provided on a cumulative basis between the voltage $V_{dd}$ on the line 82 and a digital voltage $V_{ddd}$ for the digital circuits. Similar inductances are provided between the voltage $V_{ssa}$ on the line 81 for the analog circuits and a voltage $V_{ss}$ on a line 83 and between a voltage $V_{ssd}$ on a line 85 for the digital circuits and the voltage $V_{ss}$ on the line 83.

The inductances shown in FIG. 6 combine with stray capacitances in the converters of the prior art to produce ringing in the converters. Such ringing constitutes oscillatory signals at a frequency dependent upon the values of the inductances shown in FIG. 6 and the stray capacitances in the converter. Such inductances would also produce ringing in the circuits of this invention if the features of this invention were not included.

Figure 7:
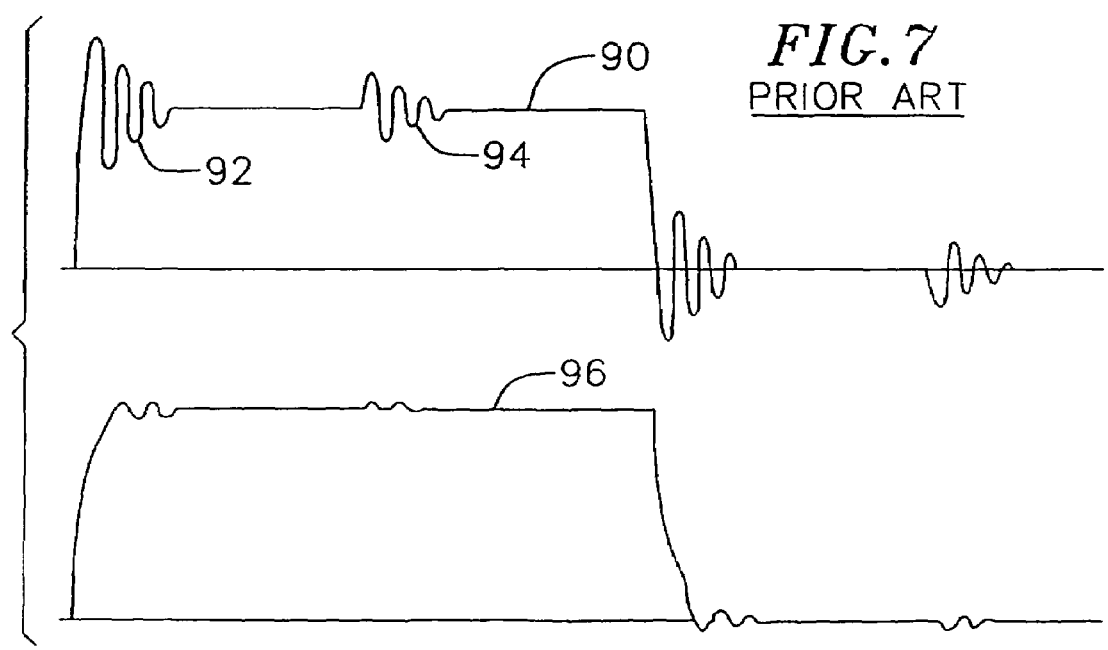
FIG. 7 provides curves showing ringing (oscillatory signals) produced in the prior art converter shown in FIG. 1 and the elimination of ringing in the digital-to-analog converter of this invention.

FIG. 7 provides two (2) voltage waveforms on a schematic basis. The upper diagram in FIG. 7 represents a voltage waveform 90 of the prior art. It shows that ringing 92 (oscillatory signals) occurs at the beginning of the signal produced by one of the current sources 63 shown in FIG. 5. Ringing 94 also occurs at the middle of the signal from the current source 63. The bottom waveform in FIG. 7 shows a waveform 96 produced by the circuitry shown in FIGS. 9 and 10 and constituting one embodiment of the invention. As will be seen, the ringing shown in the waveform 90 has been eliminated in the waveform 96.

Figure 8:
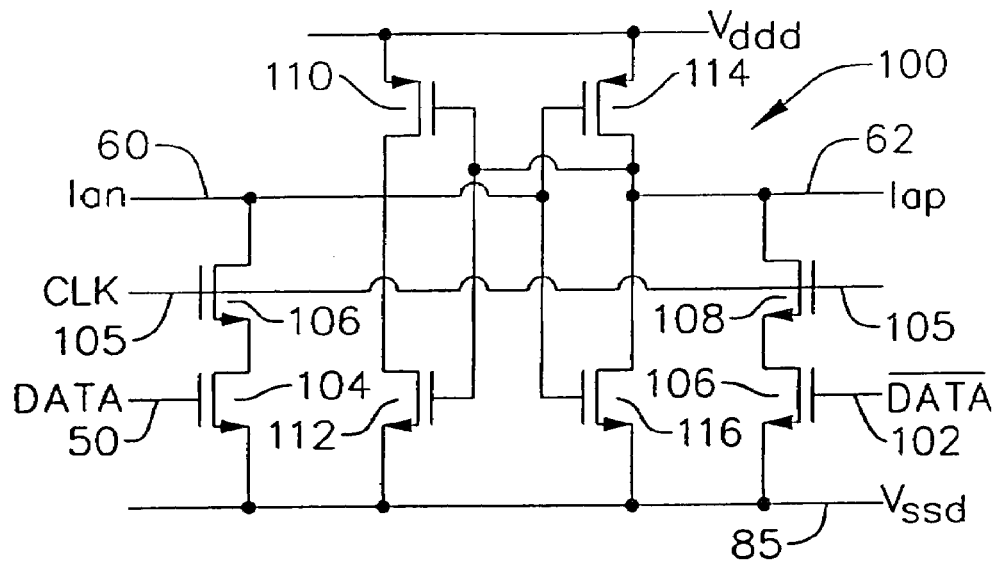
FIG. 8 is a circuit diagram of a latch of the prior art for use in the block diagram of FIG. 1.

FIG. 8 shows a latch, generally indicated at 100, of the prior art. The latch includes the voltage $V_{ddd}$ and the voltage $V_{ssd}$ on the line 85 (both also shown in FIG. 6) and the data voltage on the data line 50 in FIG. 3 and the inverse (data) of this voltage on a line 102. The data voltage on the line 50 is introduced to the gate of a transistor 104, the source of Which receives the voltage $V_{ssd}$ on the line 85. The drain of the transistor 104 and the source of a transistor 106 are common. A clock signal on a line 105 is introduced to the gate of the transistor 106 and the drain of the transistor 106 is connected to the lan line 60 also shown in FIG. 5. The transistors 104 and 106 may be CMOS transistors of the n-type.

Transistors 108 and 110 may also be CMOS transistors of the n-type. The source of the transistor 106 may be common with the $V_{ssd}$ line 85. The gate of the transistor 106 receives the data binary information on the line 102. A connection is made from the drain of the transistor 106 to the source of the transistor 108. The gate of the transistor 108 receives the clock 62 signal 105 also shown in FIG. 5.

The line 60 is connected to the drains of transistors 110 and 112 and to the gates of transistors 114 and 116. The transistors 110 and 114 may be CMOS transistors of the p type and the transistors 112 and 114 may be transistors of the n-type. In like manner, the voltage on the line 62 is introduced to the drains of the transistors 114 and 116 and to the gates of the transistors 110 and 112. The sources of the transistors 110 and 114 are connected to the $V_{ddd}$ line also shown in FIG. 6. A connection is made from the sources of the transistors 112 and 116 to the $V_{ssd}$ line 85 also shown in FIG. 6.

Assume that the data line 50 is positive and that the data line 102 is negative. This will cause current to flow through a circuit including the lan line 60 and the transistors 106 and 104 when a clock signal appears on the line 105. This causes a low voltage to be produced on the line 60. This low voltage causes the transistor 114 to become conductive and a high voltage to be produced on the drain of the transistor. This high voltage is introduced to the gate of the transistor 112. The resultant flow of current through the transistor 112 causes a low voltage to be produced on the drain of the transistor and to be introduced to the gate of the transistor 114 to make the transistor 114 even more conductive. The resultant high voltage is introduced to the lap line 62 to latch the lap line to a positive voltage. In like manner, the lan line 60 becomes latched to a negative voltage.

In like manner, when the data line 50 is negative and the data line 52 is positive, the lan line 60 is latched to a positive voltage and the lap line 62 is latched to a negative voltage. This results from the state of conductivity in the transistors 110 and 116 and the states of non-conductivity in the transistor 114 and 112.

Figure 9:
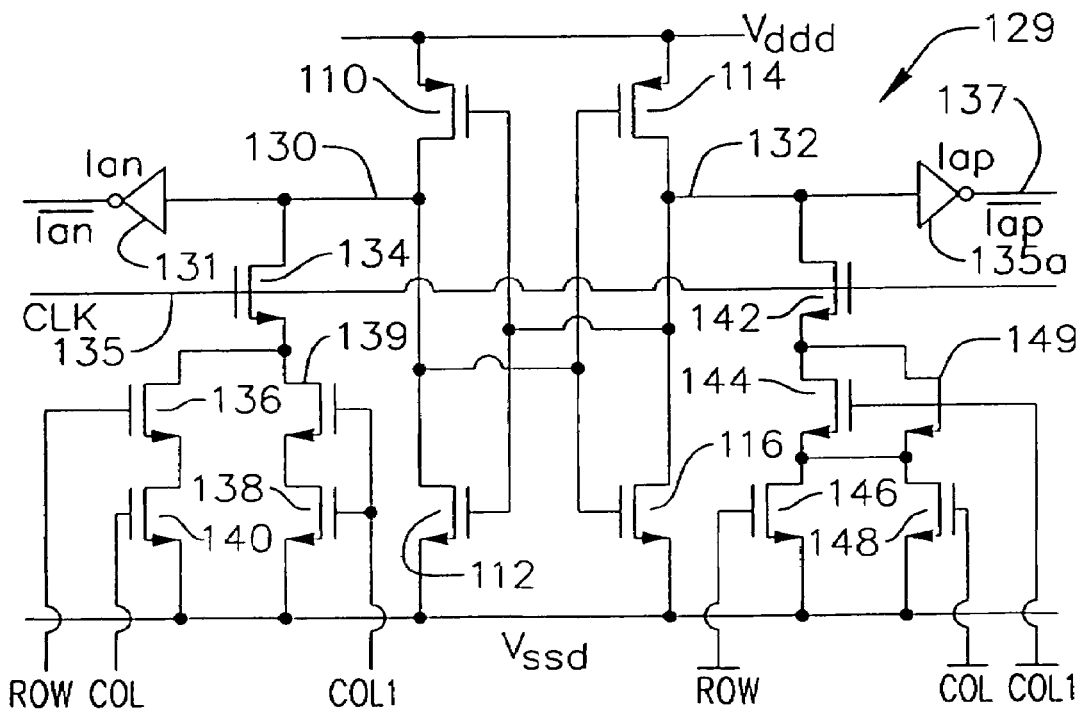
FIG. 9. is a circuit diagram of a decoder and latch which is included in the digital-to-analog converter of this invention for decoding and latching a binary indication in a cell in a matrix relationship without any ringing during the occurrence of such binary indication.

FIG. 9 shows circuitry, generally illustrated at 129, included in one embodiment of the invention. The circuitry shown in FIG. 9 combines the functions of decoding and latching. Such circuitry includes a latch formed from the transistors 110, 112, 114 and 116 in a manner similar to that described in connection with the prior art embodiment shown in FIG. 8. Such circuitry also includes decoding circuitry including a lan line 130 and a lap line 132 which provide signal outputs inverse to each other. The output on the lan line 130 is inverted as at 131 to provide a lan signal on a line 133. The lan line 130 is connected to the drains of the transistor 110 and of a CMOS transistor 134, preferably of the n-type. The transistor 134 receives a clock signal on its gate from a line 135. The source of the transistor 134 has a common connection with the drains of CMOS transistors 136, 138 and 139, all preferably of the n-type.

The gate of the transistor 136 is common with the row indication of an individual one of the cells in a matrix arrangement. A connection is made from the source of the transistor 136 to the drain of a transistor 140 which is a CMOS transistor, preferably of the n-type. The gate of the transistor 140 receives the column indication of the individual one of the cells in the matrix arrangement. The sources of the translators 138 and 140 are common with the $V_{ssd}$ line 85 also shown in FIG. 6. A binary indication of the next column is introduced to the gates of the transistors 138 and 139. The transistor 139 is included to provide a symmetry between the transistors 136 and 139 and the transistors 138 and 140.

The output of the lap line 132 is inverted as at 135a to provide a lap signal on a line 137. The lap line 132 is connected to the drain of the transistor 114 and to the drain of a transistor 142 which may be a CMOS transistor of the n-type. The clock signal on the line 135 is applied to the gate of the transistor 142. The source of the transistor 142 is common with the drains of transistors 144 and 149 which may be CMOS transistors of the n-type. A voltage representing the next column in the cell is applied to the gates of the transistors 144 and 149. The sources of the transistors 144 and 149 are applied to the drains of a pair of transistors 146 and 148, both CMOS transistors of the n-type. The gates of the transistors 146 and 148 respectively receive the binary indications of the row and column of the particular cell in the matrix relationship shown in FIG. 4. The sources of the transistors 146 and 148 are common with the $V_{ssd}$ ground line 85 also shown in FIG. 6. The transistor 149 is included to provide symmetry between the transistors 144 and 149 and the transistors 146 and 148.

It should be appreciated that the circuitry shown in FIG. 9 decodes and latches a single cell in the matrix relationship shown in FIG. 4. Similar decoding and latching circuitry is provided for each of the other cells in the matrix relationship. When binary indications of "1" are respectively applied to the gates of each of the transistors 136, 138 and 140 to represent binary indications of 1 for the row and column in the cell and for the next column in the matrix relationship, the transistors become conductive. This causes a low voltage to be applied to the drain of the transistor 134. Because of this, the transistor 134 becomes conductive when the clock signal is applied to the gate of the transistor. A low voltage is accordingly produced on the line 130. This low voltage is latched by the latching circuit including the transistors 110, 112, 114 and 116 and is inverted as at 131 to provide a lan signal on the line 133.

When the binary indications of the row and column for a cell in the matrix relationship are low and the binary indication of the next column is also low to represent binary indications of 0 for the row and column in the cell and for the next column in the matrix relationship, the transistors 146, 148 and 144 respectively become low. As a result, a low voltage is produced on the drain Of the transistor 144. The transistor 144 accordingly becomes conductive when the clock signal is introduced on the line 135 to the gate of the transistor. This causes a low voltage to be produced on the lap line 132. This low voltage is latched by the latching circuit including the transistors 110, 112, 114 and 116 and is inverted as at 135a to provide a high voltage on the line 137.

To summarize the operation of the digital to analog converter described in connection with FIG. 9, a matrix of DAC cells are formed from different "anded" combinations of states of binary indications to be decoded. One such cell is shown in FIG. 9. Transistors 136 and 140 (together with complementary transistors 144and 146) comprise one of the "anded" combinations. Transistors 138 and 139 (together with complementary transistors 148 and 149) comprise another of the "anded" combinations. The cells are sampled by clock actuated switches 134 and 142 and latched by transistors 110 and 116 and transistors 112 and 114. As represented in FIG. 9, the cells are directly connected to switches 134 and 142 without any intervening circuitry.

The combination of the decoder and the latch as shown in FIG. 9 and as described above offers certain advantages over the prior art, particularly when combined with the clock signal on the line 135. This combination significantly reduces the ringing indicated at 94 in FIG. 7. It results in part from the fact that the clock signal is introduced to the gates of the transistors 134 and 142 at a time when the binary indications on the gates of the transistors 136, 138, 139 and 140 and the gates of the transistors 144, 146, 148 and 149 have settled to a steady state value such as at the middle of the time periods shown in FIG. 7.

Figure 10:
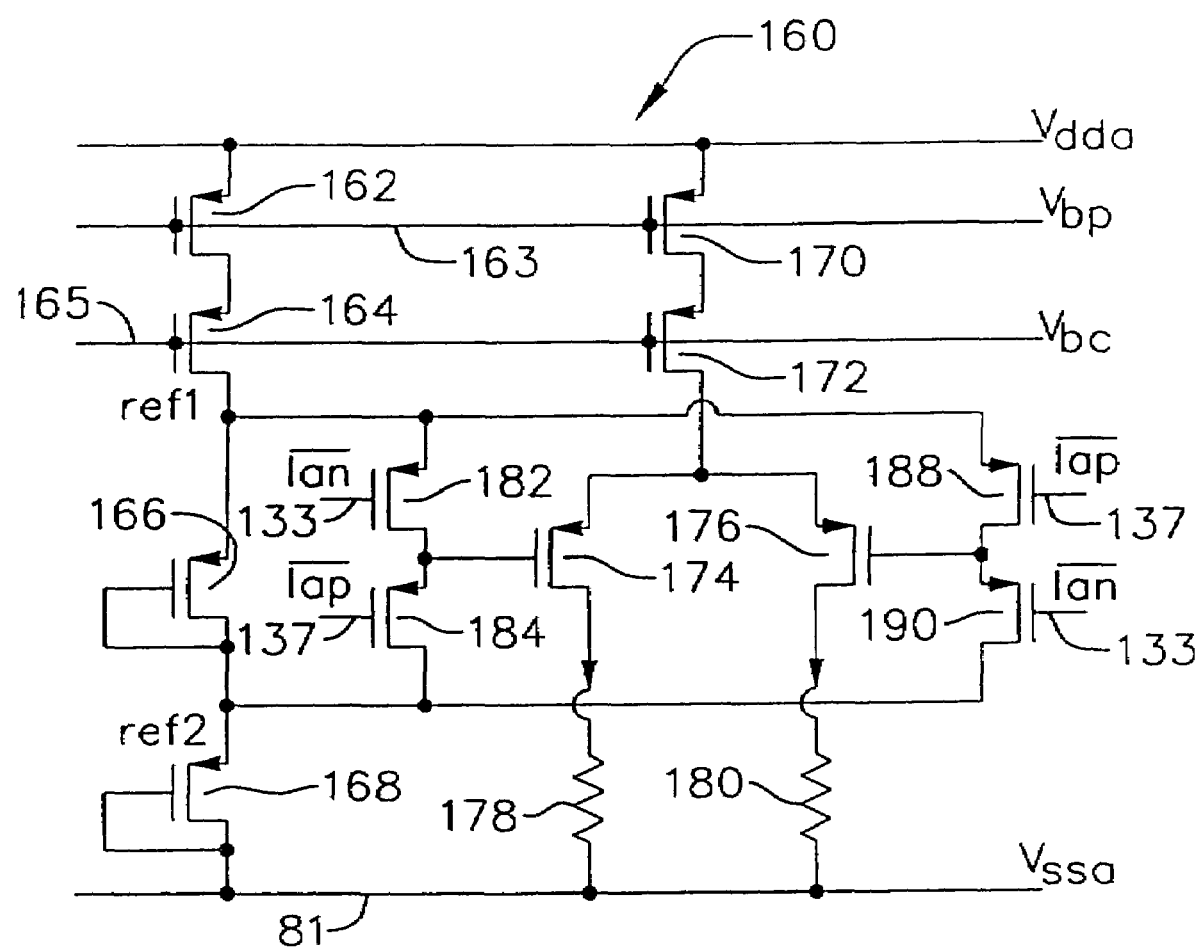
FIG. 10 is a circuit diagram of a current source which is included in the digital-to-analog converter of this invention for converting the latched binary indication in FIG. 9 for a cell in a matrix relationship to a corresponding analog current or voltage without any ringing at the transitions between successive binary indication.

FIG. 10 shows a current source and switches included in one embodiment of the invention for reducing cross talk between digital circuits and analog circuits in FIG. 10. The current source and the switches are generally indicated at 160 in FIG. 10. The circuitry 160 operates to inhibit ringing at the transitions 92 of the binary indications shown in FIG. 7. The inhibition of the ringing at the transitions 92 of the binary indications shown in FIG. 7 results in part from the fact that all of the transistors in FIG. 10 are CMOS transistors of the p-type.

CMOS transistors of the n type are disposed on the surface of the substrate of an integrated circuit chip. Because they are at the surface of the substrate, signals are able to pass through the substrate between different circuits on the substrate. This particularly occurs at the time of transitions from one signal to another. On the other hand, CMOS transistors of the p type are disposed in wells in the substrate. The disposition of the CMOS transistors of the p type in wells inhibits signals such as at the time of signal transitions from passing through the substrate between different circuits on the substrate. As a result, the inclusion of only CMOS transistors of the p type in the circuitry significantly reduces the ringing indicated at 92 in FIG. 7. As will be seen, all of the transistors shown in FIG. 10 are CMOS transistors of the p type.

The circuitry 160 includes the $V_{dda}$ voltage line 71 also shown in FIG. 6. The source of a transistor 142 is connected to the $V_{dda}$ line 71. A bias voltage is applied on a line 163 to the gate of the transistor 162. The drain of the transistor 162 is common with the source of a transistor 164. The gate of the transistor 164 receives a bias voltage $V_{bc}$ on a line 165. A connection is made from the drain of the transistor 164 to the source of a transistor 166 having a gate and drain common with the source of a transistor 168. The gate and drain of the transistor 168 are connected to the $V_{ssa}$ ground line 81 also shown in FIG. 6.

The $V_{dda}$ voltage line 7 (also shown in FIG. 6) is also connected to the source of a transistor 170 having its gate connected to the voltage bias line 164. The drain of the transistor 170 and the source of a transistor 172 are common. The gate of the transistor 172 receives the bias voltage $V_{bc}$ on the line 165. A connection is made from the drain of the transistor 172 to the sources of a pair of transistors 174 and 176. The drains of the transistors 174 and 176 are respectively connected to first terminals of a pair of resistors 178 and 180. The other terminals of the resistors 178 and 180 are connected to the $V_{ssa}$ ground line 81 also shown in FIG. 6.

The voltage on the drain of the transistor 164 is applied to the source of a transistor 182. The gate of the transistor 182 receives the lan voltage on the line 133 in FIG. 9. A connection is made from the drain of the transistor 182 to the gate of the transistor 174 and to the source of a transistor 184. The lap voltage on the line 137 in FIG. 9 is applied to the gate of the transistor 184. The drain of the transistor 184 is connected to the drain of the transistor 166.

Circuitry including transistors 188 and 190 is associated with the transistor 176 in a manner somewhat similar to the association between the circuitry including the transistors 182 and 184 with the transistor 174. The source of the transistor 188 is connected to the drain of the transistor 164. The gate of the transistor 188 receives the lap voltage on the line 132. The voltage on the drain of the transistor 188 is applied to the gate of the transistor 176 and to the source of the transistor 190. The drain of the transistor 190 is common with the drain and the gate of the transistor 166.

The transistors 162, 164, 166 and 168 are connected in series in a branch to provide reference voltages. For example, a reference voltage such as approximately 2.7 volts is produced at the drain of the transistor 164 and a reference voltage such as approximately 1.2 volts is produced at the gate and the drain of the transistor 166. Since the branch produces reference voltages, the current through the transistors in the branch is preferably a fraction—for example, one eighth (⅛) of the currents produced in the branch formed by the transistors 170, 172, 174 and 176 and the resistors 178 and 180 in FIG. 10.

Assume that the lan voltage on the line 133 is positive and that the lap voltage on the line 137 is negative. This will cause the transistor 190 to be non-conductive and the transistor 188 to be conductive. The resultant current through the transistor 188 will cause a voltage drop to be produced across the transistor. This will cause the voltage (e.g. 2.1 volts) on the gate of the transistor 176 to be lower than the voltage (e.g. 2.7 volts) on the source of the transistor. The resultant state of conductivity in the transistor 176 causes current to flow through a circuit including the $V_{dda}$ line 160, the transistors 170, 172 and 176, the resistance 180 and the $V_{ssa}$ line 81.

The current flow through the resistance 180 is substantially constant as a result of the substantially constant bias applied on the line 163 to the gate of the transistor 170. The bias applied on the line 165 to the gate of the transistor 172 causes a high impedance to be produced in the transistor. This high impedance compensates for differences in the cumulative current through the transistor at different times. These differences result from the fact that (1) the resistance 180 receives the current flowing through a number of current sources corresponding to the current source 160 and (2) the number of current sources applying current to the resistance 180 varies at each instant depending upon the relative lan and lap voltages applied, to such current sources from an individual one of the cells in the matrix relationship. The current in the resistance 180 at each instant is an accumulation of the constant currents in the different cells in the matrix where the value of the lap voltage on the line 137 is negative and the value of the lan voltage on the line 133 is positive.

In like manner, when the lap voltage on the line 137 is positive and the lan voltage on the line 133 is negative, the transistor 184 does not conduct and the transistor 182 is conductive. The resultant flow of current through the transistor 182 produces a voltage drop in the transistor. This causes the voltage (e.g. 2.1 volts) on the gate of the transistor 174 to be lower than the voltage (e.g. 2.7 volts) on the source of the transistor. A substantially constant current flows through a circuit including the resistance 178 and the transistors 170, 172 and 174. The current in the resistance 178 at each instant is an accumulation of the constant currents in the different cells in the matrix where the value of the lap voltage on the line 137 is positive and the value of the lan voltage on the line 133 is negative.

The circuitry shown in FIGS. 9 and 10 provides an accurate conversion of binary indications of the cells in a matrix relationship to an accurate analog value. The circuitry shown in FIG. 9 significantly reduces the ringing 94 during the binary indications 90 in FIG. 7. The circuitry shown in. FIG. 10 significantly reduces the ringing 92 at the time of the transitions between the binary indications 90 in FIG. 7.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

What is claimed is:

1. A method of operating a digital to analog converter (DAC) comprising:
    coupling to a matrix of DAC cells a plurality of binary indications that represent a digital value, the binary indications changing at regular intervals;
    sampling the DAC cells between the regular intervals after the binary indications change, including connecting each DAC cell to a block actuated switch between a current source and the output of the DAC; and
    latching the cells between the regular intervals.

2. The method of claim 1, additionally comprising forming the cells from different "anded" combinations of states of the binary indications.

3. The method of claim 2, in which the "anded" combinations are directly connected to respective clock actuated switches.

4. A method of operating a digital to analog converter (DAC) that receives a plurality of digital value representative binary indications, the method comprising:
    forming a matrix of DAC cells from different "anded" combinations of states of the binary indications;
    connecting each DAC cell directly to a sampling switch;
    closing the sampling switches responsive to clock pulses; and
    latching the cells after each clock pulse.

* * * * *

UNITED STATES PATENT AND TRADEMARK OFFICE
CERTIFICATE OF CORRECTION

| | | |
|---|---|---|
| PATENT NO. | : 7,170,435 B2 | |
| APPLICATION NO. | : 10/810053 | |
| DATED | : January 30, 2007 | |
| INVENTOR(S) | : Bult et al. | |

It is certified that error appears in the above-identified patent and that said Letters Patent is hereby corrected as shown below:

Title Page, Item [54], please replace "METHOD FOR OPERATING AN ANALOG TO DIGITAL CONVERTER" with --METHOD FOR OPERATING A DIGITAL TO ANALOG CONVERTER--.

Column 1, line 4, please replace "METHOD FOR OPERATING AN ANALOG TO DIGITAL CONVERTER" with --METHOD FOR OPERATING A DIGITAL TO ANALOG CONVERTER--.

Signed and Sealed this

Twenty-ninth Day of May, 2007

JON W. DUDAS
*Director of the United States Patent and Trademark Office*